United States Patent [19]
Ecklund

[11] Patent Number: 4,782,532
[45] Date of Patent: Nov. 1, 1988

[54] AUTOMATIC IF TANGENT LOCK CONTROL CIRCUIT

[75] Inventor: Lawrence M. Ecklund, Wheaton, Ill.

[73] Assignee: Motorola, Inc., Schaumburg, Ill.

[21] Appl. No.: 38,563

[22] Filed: Apr. 15, 1987

[51] Int. Cl.$^4$ ............................................. H04H 5/00
[52] U.S. Cl. ..................................................... 381/15
[58] Field of Search .................. 455/208; 381/2, 3, 4, 381/15, 16

[56] References Cited

U.S. PATENT DOCUMENTS 4,583,244  4/1986  Ecklund ................................. 381/15

OTHER PUBLICATIONS

"Laboratory Comparison of Tanlock and Phaselock Receivers" by M. Balodis, as published in the Proceedings of the National Telemetry Conference Paper 5-4 (1964).

Book entitled "Detection, Estimation, and Modulation Theory", in part II entitled Nonlinear Modulation Theory, by Harry L. Van Trees and published by John Wiley and Sons, Inc. (1971), at p. 34.

Specification sheet for the MC1302P Motorola C-QUAM (Registered Trademark) AM Stereo Decoder.

*Primary Examiner*—Forester W. Isen
*Attorney, Agent, or Firm*—Steven G. Parmelee

[57] ABSTRACT

An improved radio receiver that maintains a stable predetermined IF frequency upon receipt of input carrier signals of differing frequencies. The IF signal (14) is processed through a signal demodulation unit (16) that includes a tangent processing unit (22) to yield a control signal that varies as a tangent function of both the demodulated IF signal and a reference signal from a reference oscillator (17). This control signal is used to control the frequency and phase of a reference signal (26) used by the IF stage (12) to center the IF signal with respect to the IF stage characteristics.

5 Claims, 2 Drawing Sheets

AUTOMATIC IF TANGENT LOCK CONTROL CIRCUIT

TECHNICAL FIELD

This invention relates generally to radio receivers, and more particularly to IF processing and tangent locking principles.

BACKGROUND ART

Phase locked loops are well known in the prior art as a means of detecting a desired RF transmitted signal. Such loops detect a signal by comparison of a locally generated estimate of the signal with the received signal itself. The error in phase between the two signals is low-pass filtered (i.e., integrated), and then used to correct the local estimate to resemble the average frequency and phase of the received signal.

In general, in most radio receivers, such phase locked loops are used to lock on to the IF signal, which comprises the originally received carrier signal as altered in frequency through the IF stage, as well understood in the art. At least one prior art reference, however, suggests that phase locking can be made a function of the locally generated estimate and the incoming carrier signal to the IF stage, thereby allowing the phase locked loop to lock with respect to the incoming signal itself.

In the early 1960's, a tangent function phase locked loop was proposed. This loop phase compared an IF stage output signal with a locally generated estimate of the signal in a dual phase comparator that yielded both the sine and cosine of the phase difference between the IF signal and its estimate. These outputs could then be appropriately combined to yield a tangent function (sine divided by cosine), which resultant signal could be used as the correction signal for the loop. Since a tangent function varies its amplitude more significantly than a sine or cosine function, operation of a phase locked loop as a function of the tangent function led to increased phase comparator range and linearity, at least under some operating conditions. An example of a commercially available radio receiver part that makes use of tangent locking principles to lock on to the IF signal is the Motorola MC13020 AM Stereo Decoder integrated circuit.

To date, no one has succeeded in establishing a satisfactory tangent based phase locked loop through the IF stage of a radio receiver. Given the stability, speed, range, and parts improvement that such an arrangement would provide, a need for such a configuration clearly exists.

SUMMARY OF THE INVENTION

These and other needs are met through provision of the device described herein. The device includes a frequency translation unit (FTU) and a reference signal unit (RSU) in the IF stage. The FTU responds to receipt of: (1) an input signal that comprises a carrier signal having an information signal modulated thereon; and (2) a reference signal from the RSU. In response, the FTU provides an output signal having a frequency and phase that relates to the carrier signal as translated by the reference signal, and this FTU signal comprises the IF signal of the receiver. The IF signal is demodulated in ordinary course, with at least part of the resulting demodulated signal being used to provide a control signal to the RSU, which control signal itself varies, at least in part, as a tangent function of at least a part of the demodulated signal.

As a result, the receiver can lock to the original incoming carrier signal as a tangent function, while simultaneously providing a stable IF frequency regardless of the original input signal frequency. Therefore, the IF signal can be exactly centered to match the IF stage characteristics with significant associated improved performance.

BEST MODE FOR CARRYING OUT THE INVENTION

Figure 1:
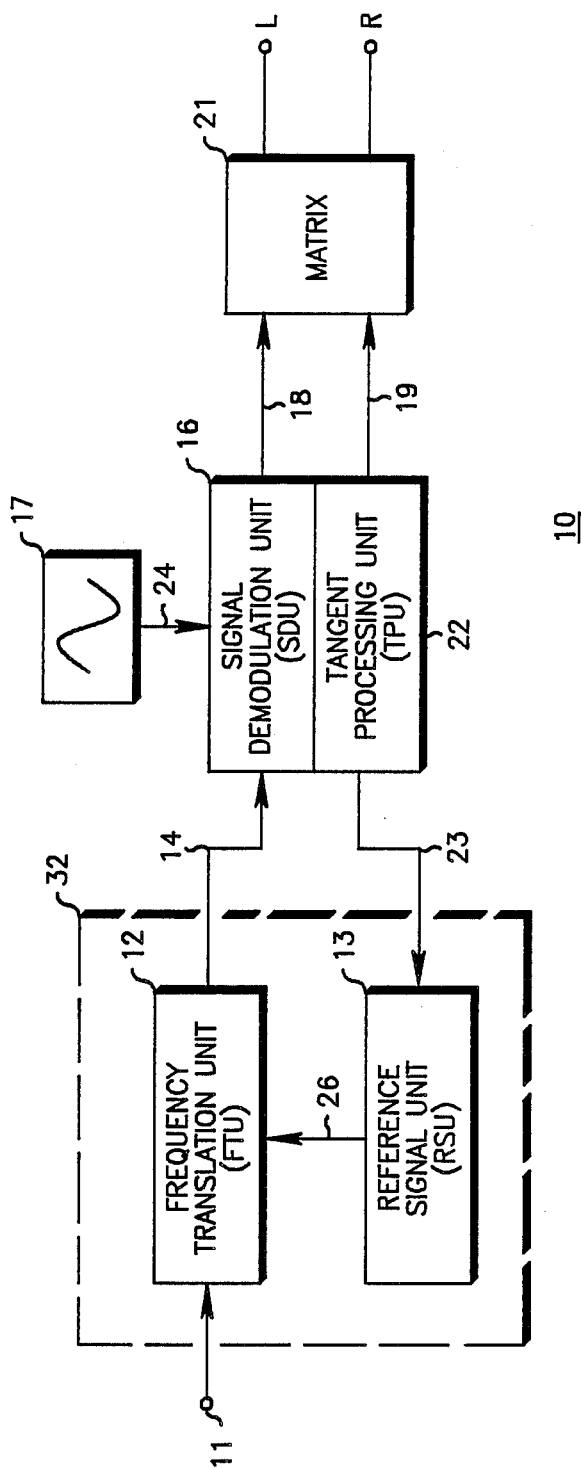
FIG. 1 comprises a block diagram view of the invention.

Referring now to FIG. 1, the device can be seen as generally depicted by the numeral 10. The device (10) operates with a radio receiver that receives an input signal at an input (11) (for purposes of this description, the input signal will be presumed to be an AM stereo modulated signal of the form $(1+L+R)\cos(wct+\phi)$ (where $\phi$ has the form arc tan $(L-R)/(1+L+R)$, L comprises left side information of a stereo signal, R comprises right side information and wct comprises the carrier signal).

The input signal is received and processed by the FTU (12) as a function of the reference signal (26) from the RSU (13) to yield an IF signal (14) of the form $(1+L+R)\cos(wit+\phi)$. A signal demodulation unit (SDU) (16) demodulates this IF signal (14), in part as a function of a demodulating signal (24) provided by a reference oscillator (17), to yield demodulated information signals (in this case, L+R (18) and L−R (19)). These demodulated signals can then be processed through a matrix (21) in accordance with well understood prior art technique to yield the L and R output signals as desired.

In addition, a tangent processing unit (TPU) (22) processes at least a part of the demodulated signals (in this case, a signal related to L−R) and uses this signal to develop a control signal (23) for the RSU (13). This control signal will vary at least in part as an average of the tangent function of the phase as multiplied by the envelope of the IF signal (14) as compared to the demodulating signal (24). As a result, the phase difference between the input signal and the reference signal (26) will be substantially equal to the frequency and phase of the demodulating signal (24) from the reference oscillator (17), thereby providing a stable IF frequency regardless of input signal frequency, and while simultaneously obtaining the benefits of tangent locking.

Figure 2:
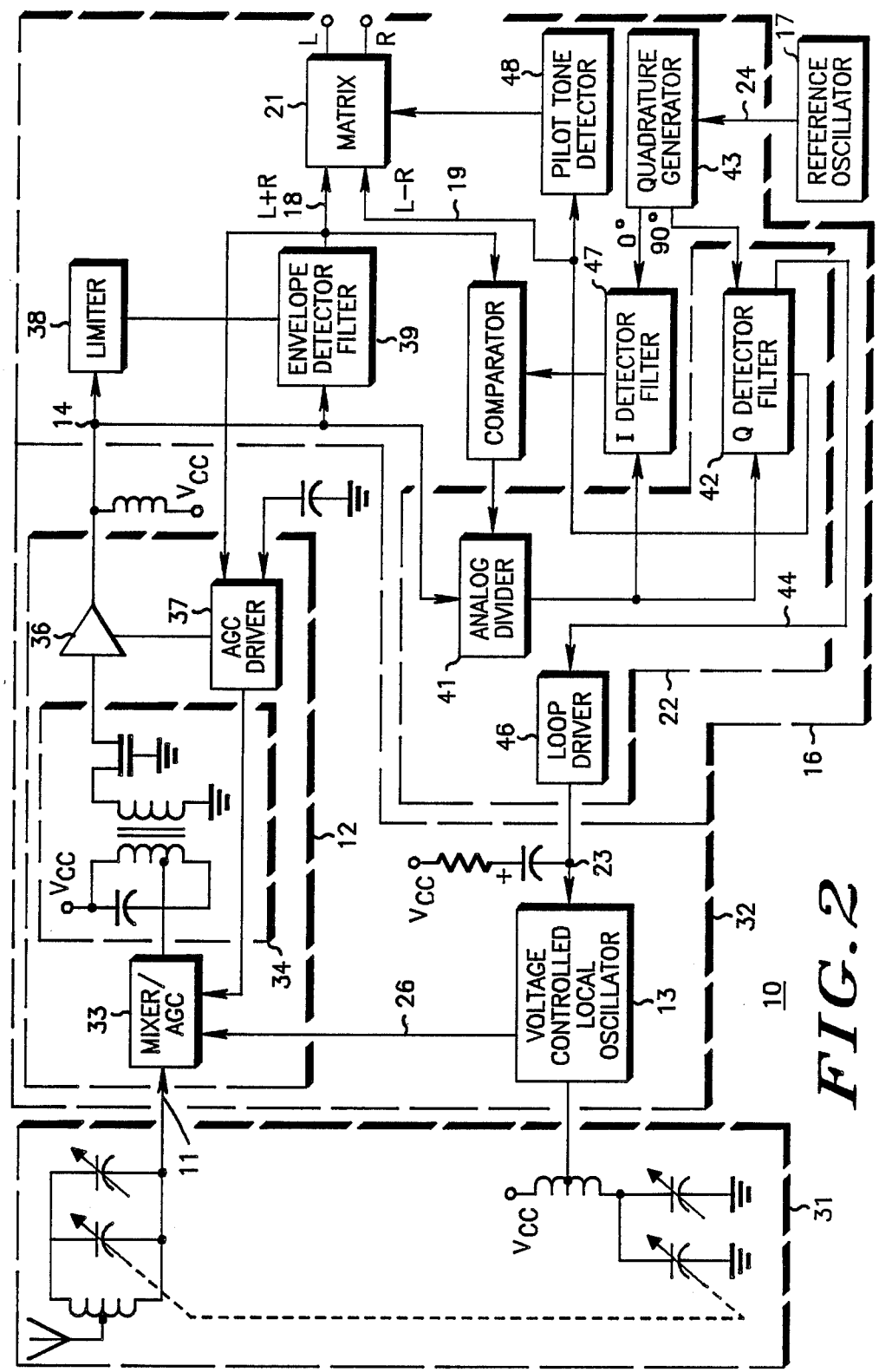
FIG. 2 comprises a more detailed block diagram view of the invention.

Referring now to FIG. 2, a more detailed description of the device (10) will be provided.

A standard ganged capacitor tuning structure (31) functions to receive the input signal, which signal passes through the input (11) of the IF stage (32). The FTU (12) includes a Mixer/AGC (automatic gain control) (33), an IF filter (34) and an IF gain AGC section (36). Both AGC units (33 and 36) respond to an AGC drive (37) that itself responds to the L+R demodulated signal from the SDU (16) to control the gain of the AGCs (33 and 36) as a function of the L+R signal The IF stage (32) also includes the RSU (13), which may be a voltage controlled local oscillator (VCLO).

The VCLO provides a reference signal (26) to the mixer (33) for use by the mixer (33) in translating the input signal and thereby creating a resultant signal having a frequency and phase related to the input signal as translated by the reference signal (26).

The IF signal (14) output passes to the SDU (16), which includes a limiter (38) and an envelope detector/filter (39) to demodulate the IF signal (14) and yield a first demodulated signal (18) comprising the L+R component, all in accordance with well understood prior art technique. The IF signal (14) also passes to the TPU (22), which includes an analog divider (41) that divides the IF signal $((1+L+R)\cos(w_it+\phi))$ where $w_it$ comprises the IF carrier) by $\cos\phi$. The resultant signal (41) passes to a Q detector/filter (42). The Q detector/filter (42) comprises a gated demodulator that flips phase 180 degrees at 90 degrees and 270 degrees with respect to a reference signal provided for that purpose, and that yields an output related to the vector quantity of the incoming signal that is in quadrature (at a given moment in time) with a reference signal provided for that purpose. In this device, the Q detector/filter (42) utilizes a signal from a quadrature generator (43) as such a reference signal (described below in more detail) to provide a signal of the form:

$$\frac{(1 + L + R)\sin(\arc\tan (L - R)/(1 + L + R)}{\cos(\phi)}$$

which can otherwise be represented as:

$$\frac{(1 + L + R)\sin(\arc\tan (L - R)/(1 + L + R)}{\cos(\arc\tan (L - R/(1 + L + R)}$$

The above, of course, constitutes a tangent function (sine divided by cosine) that essentially reduces to L−R and comprises the second demodulated signal (19). A signal (44) at least related to this L−R component can be provided to a loop driver (46) which comprises a filter that at least partially integrates the incoming signal and which provides a current proportional to the L−R term. This current comprises the control signal (23) that controls the frequency and phase of the RSU (13).

A reference oscillator (17) provides a demodulating signal (24) having a predetermined stable frequency (in this example, 3.6 MHz), which signal is provided to the quadrature generator (43). The quadrature generator (43) divides this signal (24) down to a desired frequency (in this example, 450 KHz) and provides two outputs based thereon. The first output comprises the 450 KHz signal without any phase shifts (0 degrees) and the second output comprises the 450 KHz signal with a predetermined phase shift (90 degrees). The Q detector/filter (42) described earlier uses the latter signal as set forth above to develop the L−R signal.

In operation, the loop characteristics of the interconnections between the mixer (33), the analog divider (41), the Q detector (42), the loop driver (46), and the RSU (13) cause the loop to tangent lock to thereby cause the long term average of the L−R term from the loop driver (46) to be zero. In effect, the IF signal frequency becomes locked with respect to the reference oscillator (17) demodulating signal (24) frequency, such that the average phase difference between the input signal and the reference signal (26) is substantially equal to the frequency and phase of the demodulating signal (24). By appropriate selection of the IF stage (32) components, a stable IF frequency and phase of, for instance, 450 KHz and 0 degrees, can be maintained. The VCLO will thereafter adjust its frequency and phase to cause this lock through the IF stage (32) with respect to the reference oscillator (17) to occur.

Other components are depicted as well, including an I detector (47) and a pilot tone detector (48). The presence and function of these components is well understood, and additional information regarding such components can be found, for example, in U.S. Pat. Nos. 4,377,728 and 4,489,431.

A number of advantages result through this configuration. It avoids the loss of stereo signal separation and distortion that can result when standard phase locked loops are used with single channel modulation that has an asymmetrical phase deviation with respect to the carrier that can arise in standard broadcasts. Further, by locking onto the incoming signal, as versus the IF signal, the entire system becomes locked in the center of the IF with resulting improvement in performance.

Those skilled in the art will recognize that various modifications of this invention could be made without departing from the spirit and scope of the invention. The claims should therefore not be considered as limited to the precise embodiments set forth in the absence of express limitations directed to such embodiments.

I claim:

1. A method of maintaining an IF frequency in a radio receiver substantially at a predetermined value for input signals of different frequencies, the method comprising the steps of:
   (A) in a mixer, receiving:
      an input signal of the form:

$(1+L+R)\cos(w_ct+\phi)$ where
      L and R comprise information signals;
      $w_ct$ comprises a first carrier signal; and
      $\phi$ comprises a signal of the form: arc tan $(L-R)/(1+L+R)$; and
      a reference signal;
   (B) in said mixer, providing an output IF signal based upon said input signal and said reference signal, wherein said IF signal comprises said input signal as translated in frequency and phase by an amount related to said reference signal, and wherein said IF signal is of the form:

$(1+L+R)\cos(w_it+\phi)$;

where $w_it$ comprises a second carrier signal;
   (C) dividing said IF signal by $\cos\phi$ to obtain a resultant signal of the form:

$(1+L+R)\cos(w_it+\phi)/\cos\phi$;

(D) processing said resultant signal in a Q detector to obtain a signal substantially of the form L−R and using said L−R signal to provide a control signal;
   (E) using said control signal to control frequency and phase for said reference signal; such that said IF signal frequency will remain substantially at a predetermined value for input signals of different frequencies.

2. The method of claim 1 and further including step D1 comprising substantially integrating said signal substantially of the form L−R to provide said control signal.

3. A radio receiver comprising:
(A) mixer means for receiving:
 i. an input signal of the form:

$$(1+L+R)\cos(wct+\phi)$$

where
  L and R comprise information signals;
  wct comprises a first carrier signal; and
  $\phi$ comprises a signal of the form:
  arc tan $(L-R)/(1+L+R)$; and
 ii. a reference signal;
and for providing an output IF signal based upon said input signal and said reference signal, wherein said IF signal comprises said input signal as translated in frequency and phase by an amount related to said reference signal, and wherein said IF signal is of the form:

$$(1+L+R)\cos(wit+\phi);$$

where wit comprises a second carrier signal;

(B) divider means for dividing said IF signal by $\cos\phi$ to obtain a resultant signal of the form:

$$(1+L+R)\cos(wit+\phi)/\cos\phi;$$

(C) means for processing said resultant signal in a Q detector to obtain a signal substantially of the form L−R and using said L−R signal to provide a control signal, and for using said control signal to control frequency and phase for said reference signal;
such that said IF signal frequency will remain substantially at a predetermined value for input signals of different frequencies.

4. The radio receiver of claim 3 and further including demodulation means for demodulating a signal based upon said output IF signal to provide a demodulated signal, and wherein said means for processing said resultant signal provides said control signal at least in part as a function of said demodulated signal.

5. The radio receiver of claim 4 wherein said means for processing said resultant signal provides said control signal at least in part as a tangent function of said demodulated signal.

* * * * *